United States Patent [19]

Queen et al.

[11] 4,107,613
[45] Aug. 15, 1978

[54] WIRELESS MICROPHONE WITH FM RECEIVER MUTING SYSTEM RESPONSIVE TO EXCESSIVE UNDESIRED AM LEVEL OR LOW AGC CONTROL LEVEL

[75] Inventors: Daniel L. Queen, Chicago; Kenneth W. Belt, Berwyn, both of Ill.

[73] Assignee: Perma-Power Inc.

[21] Appl. No.: 767,972

[22] Filed: Feb. 11, 1977

[51] Int. Cl.$^2$ .............................................. H04B 1/10
[52] U.S. Cl. .................................... 325/348; 325/403; 325/478
[58] Field of Search ................. 325/348, 402, 403, 478

[56] References Cited

U.S. PATENT DOCUMENTS

| 2,509,381 | 5/1950 | Werner et al. | 325/478 |
| 3,188,571 | 6/1965 | Michael | 325/402 |
| 3,323,066 | 5/1967 | Kurtz | 325/478 |
| 3,482,166 | 12/1969 | Gleason | 325/341 |
| 3,569,840 | 3/1971 | Tanaka et al. | 325/478 |

Primary Examiner—Robert L. Griffin
Assistant Examiner—Marc E. Bookbinder
Attorney, Agent, or Firm—Hill, Gross, Simpson, Van Santen, Steadman, Chiara & Simpson

[57] ABSTRACT

A wireless microphone and receiver in which the receiver output is muted whenever there is insufficient carrier present at the receiver to provide a clear noise free recovered audio or when there is radio frequency interference of a nature in strength to cause amplitude modulation on the IF envelope at the input to the FM detector. The invention places the receiver into a sampling mode whenever it is in a muted condition to conserve batteries and to provide a visual indication of such condition.

9 Claims, 3 Drawing Figures

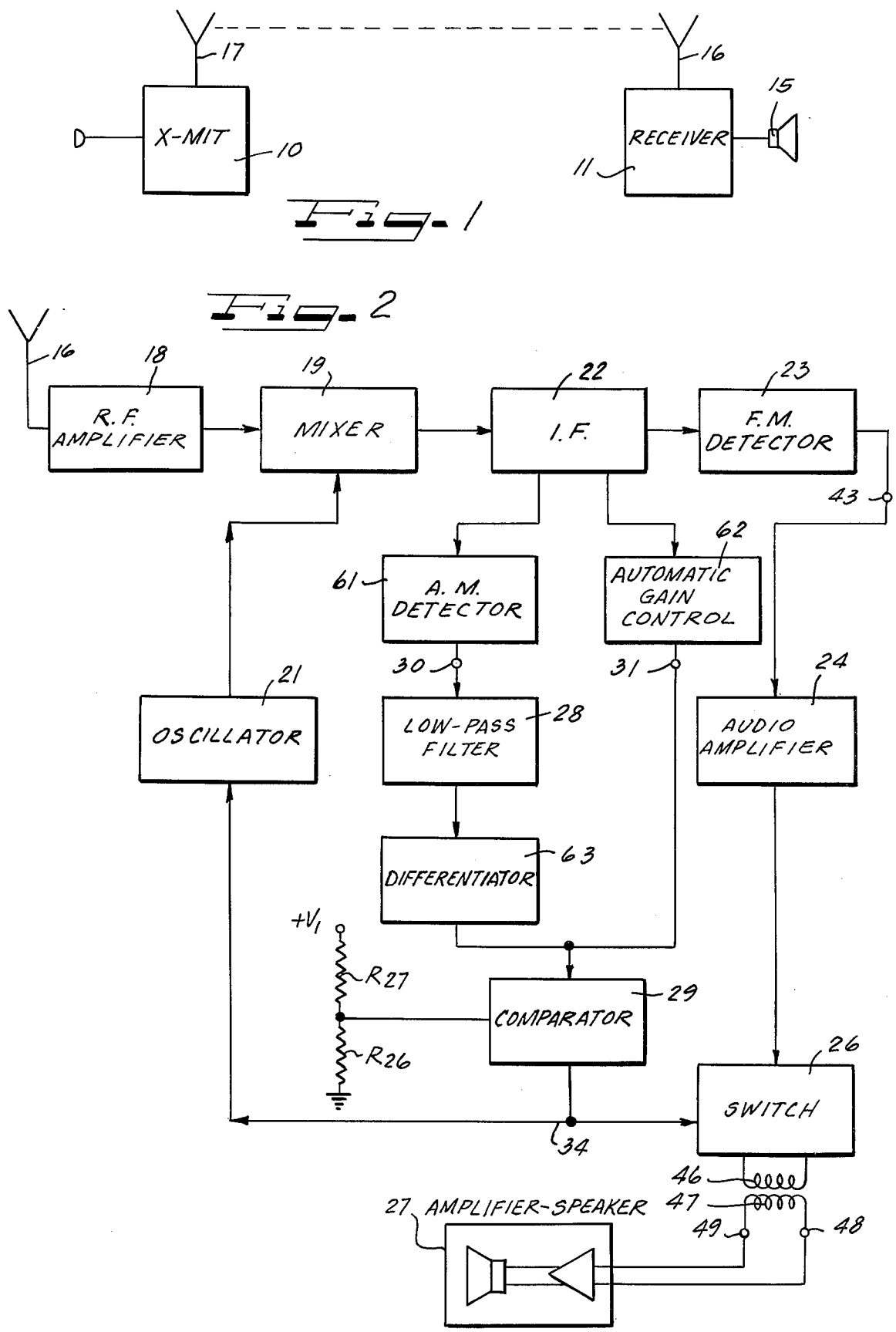

WIRELESS MICROPHONE WITH FM RECEIVER MUTING SYSTEM RESPONSIVE TO EXCESSIVE UNDESIRED AM LEVEL OR LOW AGC CONTROL LEVEL

BACKGROUND OF THE INVENTION

1. Field of the Invention

This invention relates in general to remote microphones and receivers and in particular to a novel circuit for muting the output of the receiver under certain conditions.

2. Description of the Prior Art

Remote microphones which comprise means for transmitting an audio signal on a radio frequency carrier and which utilize a radio receiver for detecting the radiation and demodulating it are well known. However, in such systems of the prior art when the microphone user moves out of range of the receiver or wherein spurious radiation such as police radio stations or other radiation are present can interfere and cause undesirable noise and audio signals to be reproduced at the receiver. For example, in an auditorium where a remote wireless microphone is being used if a police car or other vehicles were to pass the auditorium and radiate a spurious signal it is possible with present day wireless microphones and receivers that such spurious signal would be detected and interfere with or even be reproduced at the output of the receiver.

SUMMARY OF THE INVENTION

The present invention provides a wireless microphone and receiver which utilizes a squelch circuit and also has a secondary squelch circuit which is triggered by the presence of any amplitude modulation, and which operates without audible switching noise. In the present invention, the receiver is muted so that the audio is disconnected from the output amplifier-speaker 27 when there is insufficient carrier present at the receiver input to provide clear noise free recovered audio. Also, the receiver is muted when the radio frequency interference is of a nature in strength to cause the amplitude modulation to be present on the IF envelope at the input to the FM detector. The invention places the system into a sampling mode whenever it is in the muted condition so as to conserve batteries and also provides a visual indication of that condition.

Other objects, features and advantages of the invention will be readily apparent from the following description of certain preferred embodiments thereof taken in conjunction with the accompanying drawings, although variations and modifications may be effected without departing from the spirit and scope of the novel concepts of the disclosure, and in which:

BRIEF DESCRIPTION OF THE DRAWINGS

FIG. 1 is a block diagram showing the remote microphone with the transmitter and receiver;

FIG. 2 is a block diagram of the invention in the receiver; and

DESCRIPTION OF THE PREFERRED EMBODIMENTS

Figure 3:
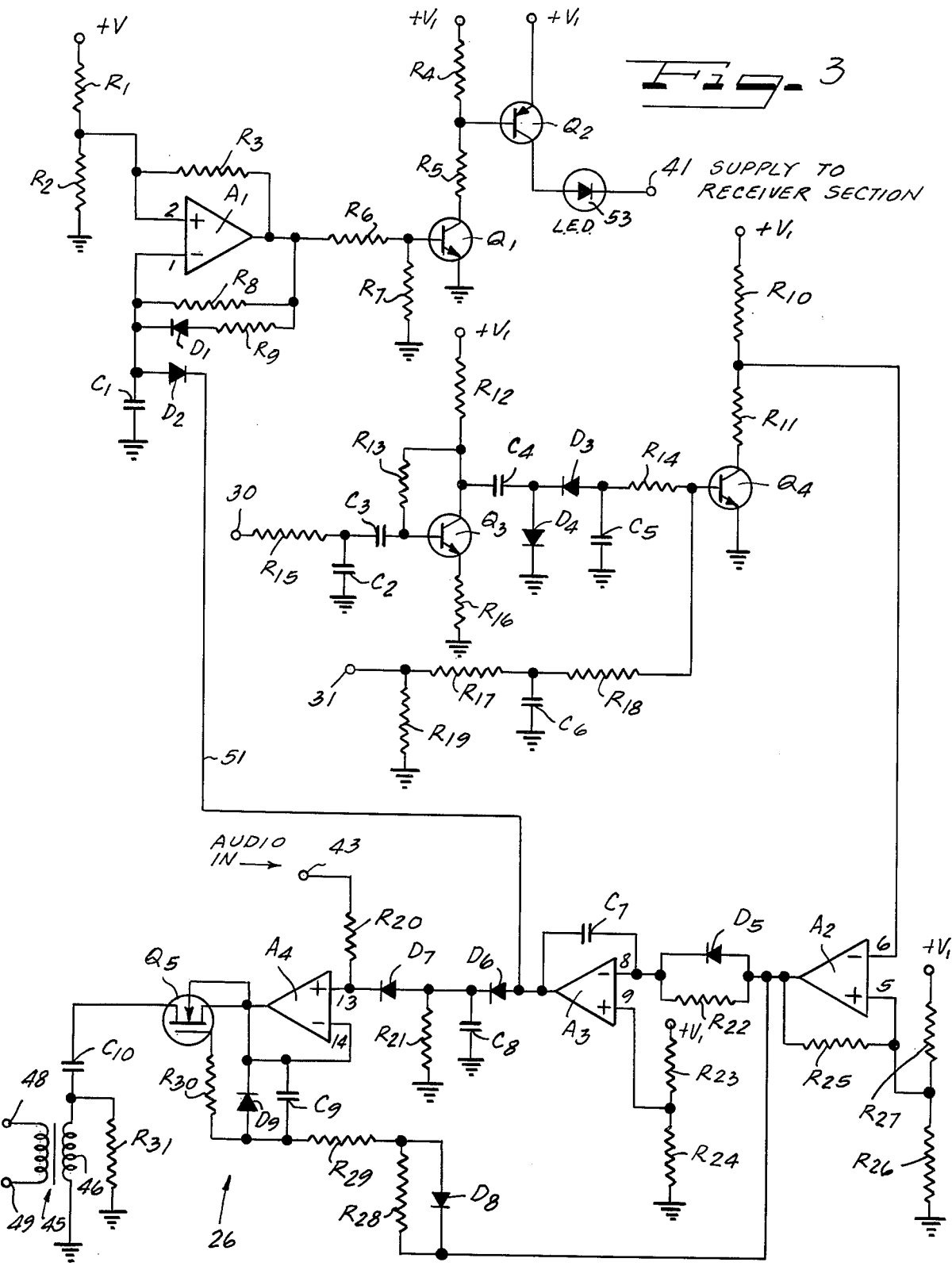
FIG. 3 is a detail schematic view of the invention.

FIG. 1 illustrates a remote microphone comprising a microphone and transmitter 10 and a receiver 11 which is connected to a suitable audio output as for example, an audio power amplifier and speaker.

FIG. 2 illustrates the receiver 11 comprising receiving antenna 16 which receives the radiated signal from the transmitting antenna 17 from the transmitter 10. An RF amplifier 18 receives the output of the antenna 16 and supplies it to a mixer 19 which also receives an injection frequency from an oscillator 21. An IF 22 receives the output of the mixer 19 and supplies an input to an FM detector 23 which supplies an output to an audio amplifier 24. A switch 26 receives the output of the audio amplifier 24 and is connected to an audio output which may be connected to an amplifier-speaker 27. The output of the IF amplifier 22 is also connected to an AM detector 61 and to an automatic gain control 62 and to a comparator 29. A low-pass filter 28 is connected to detector 61 and supplies an output to differentiator 63. A comparator 29 receives the output of differentiator 63 and AGC 62. The comparator 29 also receives an input from a voltage divider comprising resistors R27 and R26 connected between ground and a reference voltage V1. A switch 26 is controlled by comparator 29 which controls the audio output to amplifier-speaker 27. The output of comparator 29 can also be connected by lead 34 to the oscillator 21 such that when the comparator 29 changes its condition the output frequency of the oscillator 21 is changed so as to change the tuning frequency of the receiver.

In the invention, when the user of the remote microphone and transmitter 10 goes out of range of the receiver 11 or if interference such as from a police car or a CB transmitter passes in the vicinity of the receiver 11 the invention will disconnect the audio output from the amplifier-speaker 27 so as to prevent such interference from coming through and being heard on the output of the speaker. (The invention can also switch the receiver to a different channel or to different antenna wherein interference does not occur if desirable and this can be accomplished by the output of comparator 29.)

In the present invention, a spurious AM modulation occurring in the IF 22 will be detected by detector 61 and will appear as audio noise. A steady state difference comprising DC does not indicate the presence of AM modulation so that output of the lowpass filter 28 is passed through a differentiator 63 which produces an output other than zero only when AC components are present in the output. This AC component is supplied to comparator 29 and controls the condition of the switch 26 so as to disconnect the audio output when such AM signal is present.

FIG. 3 is an electrical schematic diagram of the invention and terminal 31 represents the output of the AGC 62 illustrated in FIG. 2 and this signal represents the IF level of the receiver. This signal becomes increasingly positive as the IF input level increases. Terminal 31 is connected to ground through resistor R19 and through resistor R17 to a capacitor C6 which has its other side connected to ground. A resistor R18 is connected from the resistor R17 to the base of a transistor Q4. Resistors R17, R18 and R19 and capacitor C6 form a network which provides a load to the output appearing at terminal 31 and integrates the level to eliminate any brief transients or RF which may be present. When the DC voltage across capacitor C6 exceeds the base emitter diode voltage of the transistor Q4 which would normally be about 0.6 volts, the difference voltage will appear across resistor R18 and produce a current in the base of transistor Q4. This will permit collector current in transistor Q3. The AGC output voltage will not exceed 0.6 v unless there is sufficient signal strength (RF) to keep the IF output in limiting (this means noise-free reception). The collector of transistor Q4 is connected to a positive voltage plus V1 through resistors R11 and R10.

The output of the AM detector 61 is indicated by point 30 which is connected through resistor R15 and capacitor C3 to the base of a transistor Q3. Capacitor C2 is connected from the other side of the resistor R15 to ground. The emitter of transistor Q3 is connected to ground through resistor R16. The collector of transistor Q3 is connected to the base through resistor R13. The collector is connected to bias voltage V1 through resistor R12. The collector of transistor Q3 is connected to a capacitor C4 which has its other side connected to a diode D4 which has its cathode connected to ground. A diode D3 has its cathode connected to the other side of capacitor C4 and its anode is connected to one side of resistor R14 which has its other side connected to the base of transistor Q4. A capacitor C5 is connected between the resistor R14 and ground. The input signal at point 30 contains any amplitude modulation present plus a DC component. Resistor R15, capacitor C2 and capacitor C3 form a band pass network which eliminates the DC component and shorts high frequency components to ground through the capacitor C2. Neither the DC signal nor the high frequency signal would produce audible output at the speaker. The transistor Q3 is an amplifier to increase the level of any noise signal appearing on its base. Resistor R13 provides stable bias to the transistor and resistor R16 limits the gain of the amplifier by emitter degeneration. The resistor R12 provides a DC collector load for the transistor Q3.

The diodes D3 and D4 and the capacitors C4 and C5 form a voltage doubler which produces a negative DC voltage proportional to the AC level present at the collector of transistor Q3. This negative DC level is applied to the base of the transistor Q4 through the resistor R14 and when there are sufficient amplitude modulation noise signals to cause noise to be added to the recovered audio, this negative level is sufficient to override the positive voltage supplied through terminal 31 and, thus, cut off transistor Q4.

An operational amplifier A2 operates as a comparator. Its input terminal 6 is connected between the resistors R10 and R11 and its input terminal 5 is connected to ground through a resistor R26 and to the positive bias voltage B1 through resistor R27. A resistor R25 is connected between terminal 5 and the output of the amplifier A2. The resistors R10 and R11 comprise the DC load for the collector of transistor Q4. Whenever there is sufficient output at terminal 31 and no amplitude modulation noise transistor Q4 will receive base current and therefore will produce a collector current. This will cause a voltage drop across resistor R10 and therefore reduce the voltage at the inverting input to the operational amplifier A2. Resistors R26 and R27 provide a reference voltage to the non-inverting input of operational amplifier A2. Resistor R25 introduces some positive feedback which produces a hysteresis for decisive comparator action. Therefore, when the voltage at lead 42 approaches the voltage at input 5 of amplifier A2 the comparator A2 will suddenly change state. The resistor R11 prevents the voltage at the "6" input to operational amplifier A2 from approaching ground potential when transistor Q4 is saturated.

The inputs to the operational amplifiers illustrated in FIG. 3 should not approach the negative supply voltage which in the illustrated example is ground due to the limitations of their internal circuitry.

The audio output of the receiver is supplied to terminal 43 and in the receiver the audio output has a DC level which is approximately at the center of the supply voltage. This is used to bias amplifier A4 to center supply and is connected to terminal 13 of the amplifier A4. The amplifier A4 is used as a unity gain DC amplifier. A resistor R20 is connected between terminal 43 and input 13 of amplifier A4. A diode D7 is connected between terminal 13 of amplifier A4 and a resistor R21 which has its other side connected to ground. A capacitor C8 is connected in parallel with resistor R21. A diode D6 is connected between diode D7 and the output of an amplifier A3. A diode D5 and resistor R22 are connected in parallel and connected between the output of the amplifier A2 and input terminal 8 of the amplifier A3. A capacitor C7 is connected between terminal 8 of amplifier A3 and the output of amplifier A3. Input terminal 9 of amplifier A3 is connected to the midpoint between resistors R23 and R24. The other side of resistor R23 is connected to plus V1 voltage and the other side of resistor R24 is connected to ground. The output of amplifier A4 is connected to its inverting input terminal 14 so that its output will equal the voltage at its non-inverting input 13. This would normally be about 6 volts DC with the audio deviating about this DC level.

A field effect transistor Q5 is used as an analogue switch for gating the audio output and has an input applied to it from the amplifier A4. When the gate to source voltage is zero or slightly positive, a drain to source resistance appears as a low impedance for DC and AC currents. As the gate to source voltage becomes negative the drain to source impedance increases to a very high value. A capacitor C10 is connected between the field effect transistor Q5 and the primary 46 of a transformer 45. The primary has its other side connected to ground and a resistor R31 is connected in parallel with the primary 46. The secondary 49 of the transformer 45 has its opposite ends connected to terminals 48 and 49 to which the audio power amplifier-speaker 27 are connected as illustrated in FIG. 2. The capacitor C10 removes the six volt DC level at the output of amplifier 84 and applies the audio to the primary 46. When the transistor Q5 is cut off, (has a high drain to source impedance) virtually no audio signal will be applied to the primary or secondary of the transformer 45 and the amplifier and speaker will produce no audio output. The resistor R31 maintains a low impedance across the primary 46 of the transformer 45 when the transistor Q5 is cut off so that noise pickup in the output wiring does not feed through to the amplifier. A resistor R30 is connected from the transistor Q5 to a resistor R29 which has its other side connected to the parallel combination of a resistor R28 and a diode D8. The other side of the parallel combination is connected to the output of amplifier A2. A diode D9 and capacitor C9 are connected in parallel between the junction point between the resistors R29 and R30 and the output of the amplifier A4.

The resistor R30 protects the gate of transistor Q5 against transient or forward bias currents. The diode D9 limits the forward bias to the gate to approximately 0.6 volts in a specific exmaple and the capacitor C9 serves two purposes. One, it has a low impedance to AC signals and therefore keeps the gate and source of the field effect transistor Q5 at the same AC potential. This prevents the transistor Q5 from amplifying the audio at the output of the amplifier A4 as it passes through a linear bias region. Two, the capacitor C9 also provides a time constant with resistor R28 and R29 which smooths out the changes in the gate bias when the comparator A2 changes state. An abrupt change in muting would produce an audible effect at the output of the speaker. When the output of the comparator A2 goes to its low state which might be one or two volts the transistor Q5 mutes fairly rapidly through the diode D8 which is forward biased and resistor R29. The two volt output of the comparator applied to the gate of the transistor Q5 is negative with respect to the 6 volt level at the output of amplifier A4 which is connected to the source of field effect transistor Q5. When the comparator A2 changes to a high state which might be 10 or 11 volts field effect transistor Q5 comes out of its muting state more slowly due to the longer time constant of the capacitor C9 and the resistors R28 and R29 since diode D8 is reverse biased. This allows time for other desired actions to occur before the field effect transistor Q5 is unmuted.

When the system is muted, the receiver section is put into a sampling mode and during this mode the audio output contains a switched 6 volt DC level which is difficult to attenuate. Therefore, this DC level is removed from the input to amplifier A4 terminal 13 when the comparator A2 changes to its lower state. The amplifier A3 is used as an inverting integrator. The resistors R23 and R24 provide a center supply bias to the non-inverting input of amplifier A3 at input 9. When the output of comparator A2 changes to a low state the output of inverting integrater A3 slowly rises to a high state with a slope determined by the capacitor C7 and the resistor R22 and D5 is reversed bias. This gives time for the field effect transistor Q5 to mute before any changes occur at the input to amplifier A4 at input terminal 13. Capacitor C8 charges to the voltage at the output of the integrator A3 through diode D6. Since the voltage across capacitor C8 eventually becomes about 10 volts, about 9.4 volts will be applied to input 13 of amplifier A4 through diode D7. Therefore, the 0 to 6 volts switching signal from terminal 43 applied through resistor R20 will have little effect on the voltage at input 13 of amplifier A4. When the comparator A2 changes to its high state, the output of inverting integrater will change abruptly to a low state since diode D5 will be forward biased. Capacitor C8 will discharge through resistor R21 and diode D7 and resistor R20 until 6 volts exists and then continue to discharge through resistor R21. Since the diode D7 becomes reversed biased, it is a high AC impedance and does not degrade the impedance at input 13 of amplifier A4. This action takes place more rapidly than the unmuting of field effect transistor Q5 therefore returning amplifier A4 to a stable bias before unmuting occurs.

An amplifier A1 is connected in circuit to form a free running multi-vibrator. Its input terminal 2 is connected to the mid-point of resistors R1 and R2 which are connected between positive bias voltage V1 and ground. A resistor R3 is connected to terminal 2 and the output of amplifier A1. A capacitor C1 is connected between ground and input terminal 1 of amplifier A1. A resistor R8 is connected between input 1 and the output of amplifier A1. A diode D1 and resistor R9 are connected in parallel with resistor R8. A resistor R6 is connected between the output of amplifier A1 and the base of transistor Q1. A resistor R7 is connected between the base of transistor Q1 and ground. The emitter of transistor Q1 is connected to ground and its collector is connected to positive V1 voltage through resistors R5 and R4. The base of transistor Q2 is connected to the midpoint between resistors R5 and R4 and its emitter is connected to the positive voltage V1. The collector of transistor Q2 is connected to a light emitting diode 53 which has its other side connected to terminal 41.

The amplifier A1 operates as a free running multivibrator and resistors R1 and R2 provide a center supply bias and resistor R3 supplies positive feedback for hystersis. When capacitor C1 is discharged, which is the initial condition, the voltage at input 1 of amplifier A1 which is the inverting input will be lower than the voltage at input 2 which is the non-inverting input. Thus, the output of amplifier A1 will be high and the resistor R3 raises the voltage at input 2. Capacitor C1 then charges through resistors R8 and R9 and diode D1 which is forward bias until it approaches the voltage at input 2 of amplifier A1. The output then begins to transfer to a lower voltage and the feedback through resistor R3 decreases and the input 2 voltage decreases. Thus, the output regenerates to a low state and capacitor C1 will discharge through resistor R8 with D1 being reverse bias until it approaches the voltage at input 2 of amplifier A1 and the output regenerates to a high state.

In this manner, the circuit produces a pulse train of less than 50% duty cycle.

The resistor R6 applies this pulse train to the base of transistor Q1. Resistor R7 reduces the low state output voltage of amplifier A1 to less than 0.6 volts to ensure that transistor Q1 will be cut off during this state. During the high state of amplifier A1, transistor Q1 will be in saturation and provide base drive to transistor Q2 through R5. R4 provides DC stability to Q2 when transistor Q1 is cut off. Therefore, when the output of amplifier A1 is high, transistor Q1 will be saturated as well as transistor Q2 thereby applying supply current through the light emitting diode 53 to the receiver through terminal 41.

When the output of amplifier A1 is low, the supply to the receiver terminal 41 will be cut off. It is to be noted that the light emitting diode 53 will be flashing. When the output of inverting integrator A3 goes to a low state, capacitor C1 will be held discharged through diode D2 and lead 51 and amplifier A1 will remain in a high state which keeps the receiver in the ON condition. As inverting integrator A3 transfers to a high state, the capacitor C1 will charge through the resistors R8 and R9 and the multi-vibrator including amplifier A1 will resume oscillation.

In a specific embodiment according to the invention, the following component values were used:

R1 — 100K ohms
R2 — 100K ohms
R3 — 100K ohms
R4 — 39k ohms
R5 — 10K ohms
R6 — 10K ohms
R7 — 3300 ohms
R8 — 120K ohms
R9 — 10K ohms
R10 — 22K ohms
R11 — 2200 ohms
R12 — 10K ohms
R13 — 2.2 meg ohms
R14 — 22K ohms R15 — 10K ohms
R16 — 470 ohms R17 — 39K ohms
R18 — 22K ohms
R19 — 68K ohms
R20 — 100K ohms
R21 — 120K ohms
R22 — 4.7 meg ohms
R23 — 100K ohms
R24 — 100K ohms
R25 — 100K ohms
R26 — 100K ohms
R27 — 100K ohms
R28 — 1 meg ohms
R29 — 100K ohms
R30 — 100K ohms
R31 — 2200 ohms Voltage plus VI was plus 12 volts.
C1 — 10 mfd
C2 — 0.001 mfd
C3 — 0.01 mfd
C4 — 0.5 mfd
C5 — 0.1 mfd
C6 — 0.39 mfd
C7 — 0.22 mfd
C8 — 2.7 mfd
C9 — 1 mfd
C10 — 68 mfd The field effect transistor Q5 was an RCA type 40468A and the amplifiers A1, A2, A3 and A4 are available in an integrated circuit Raytheon type RC4136 which was operated between plus 12 volts and ground.

It is seen that this invention provides a novel circuit and apparatus for preventing undesirable audio signals from appearing at the output of a wireless microphone and although it has been described with respect to preferred embodiments it is not to be so limited as changes and modifications can be made therein which are within the full intended scope as defined by the appended claims.

We claim as our invention:

1. An audio muting system for a remote microphone including an FM transmitter and a receiver having an I.F. section, an F.M. detector, an automatic gain control, an A.M. detector to detect undesired amplitude modulation, said F.M. detector, said automatic gain control and said A.M. detector receiving inputs from said I.F. section, and an audio output comprising a comparator receiving the outputs of said A.M. detector and said automatic gain control, and switch means connected between the output of said F.M. detector and said audio output and controlled by said comparator such that said audio output is disconnected when the output of said A.M. detector exceeds a predetermined level or when the output of said automatic gain control falls below a predetermined level including a low-pass filter connected to the output of said A.M. detector and a differentiator connected between said low-pass filter and said comparator.

2. An audio muting circuit according to claim 1 wherein said switch means is a field effect transistor.

3. An audio muting circuit according to claim 2 wherein said comparator comprises a transistor and an operational amplifier.

4. An audio muting system for a remote microphone including an FM transmitter and a receiver having an I.F. section, an automatic gain circuit, an A.M. detector to detect undersired amplitude modulation, an F.M. detector said automatic gain circuit, said A.M. detector and said F.M. detector receiving inputs from said I.F. section and an audio speaker comprising a first transistor with the output of said A.M. detector coupled to its base electrode, a second transistor with its base coupled to the collector of said first transistor and the output of said automatic gain control circuit connected to its base electrode, a first operational amplifier receiving a fixed reference voltage on a first input and having a second input coupled from the collector of said second transistor, and a switch controlled by said first operational amplifier and connected between said audio speaker and the output of said F.M. detector.

5. An audio muting circuit according to claim 4 wherein said switch comprises a field effect transistor.

6. An audio muting circuit according to claim 5 including a free running multi-vibrator coupled to said field effect transistor.

7. An audio muting circuit according to claim 5 including a second operational amplifier connected between said first operational amplifier and said switch and connected as an inverting integrator.

8. An audio muting system for a remote microphone including an FM transmitter and a receiver having an I.F. section, an F.M. detector, an automatic gain control, an A.M. detector to detect undesired amplitude modulation, said F.M. detector, said automatic gain control and said A.M. detector receiving inputs from said I.F. section, and an audio output comprising a comparator receiving the outputs of said A.M. detector and said automatic gain control, and switch means connected between the output of said F.M. detector and said audio output and controlled by said comparator such that said audio output is disconnected when the output of said A.M. detector exceeds a predetermined level or when the output of said automatic gain control falls below a predetermined level, including a low-pass filter connected between said A.M. detector and said comparator.

9. An audio muting system according to claim 8 including tuning means connected to said comparator means so as to change the receiving frequency of said receiver when said output of said A.M. detector exceeds a predetermined level or the output of said automatic gain control falls below a predetermined level.

* * * * *